United States Patent
Watanabe et al.

(10) Patent No.: US 10,181,437 B2
(45) Date of Patent: Jan. 15, 2019

(54) PACKAGE SUBSTRATE AND METHOD OF MANUFACTURING PACKAGE SUBSTRATE

(71) Applicant: FUJITSU LIMITED, Kawasaki-shi, Kanagawa (JP)

(72) Inventors: Manabu Watanabe, Yokohama (JP); Kenji Fukuzono, Kawasaki (JP); Yuki Hoshino, Yokohama (JP); Masateru Koide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 16/001,980

(22) Filed: Jun. 7, 2018

(65) Prior Publication Data

US 2018/0358289 A1 Dec. 13, 2018

(30) Foreign Application Priority Data

Jun. 12, 2017 (JP) .................. 2017-115291

(51) Int. Cl.
*H01L 23/498* (2006.01)
*H01L 21/48* (2006.01)

(52) U.S. Cl.
CPC .... *H01L 23/49816* (2013.01); *H01L 21/4853* (2013.01); *H01L 23/49838* (2013.01)

(58) Field of Classification Search
CPC ......... H01L 23/49816; H01L 23/49838; H01L 21/4853

USPC .......................................................... 174/250
See application file for complete search history.

(56) References Cited

U.S. PATENT DOCUMENTS

| | | | | |
|---|---|---|---|---|
| 2009/0154125 A1* | 6/2009 | Fujii | ..................... | H01L 21/561 361/767 |
| 2009/0154132 A1* | 6/2009 | Okamoto | ............ | H01L 23/5389 361/804 |
| 2010/0181102 A1* | 7/2010 | Abe | ....................... | H05K 1/111 174/260 |

FOREIGN PATENT DOCUMENTS

| | | |
|---|---|---|
| JP | H11-74637 A | 3/1999 |
| JP | 2010-161205 | 7/2010 |
| JP | 2011-119765 A | 6/2011 |

* cited by examiner

*Primary Examiner* — Sherman Ng
(74) *Attorney, Agent, or Firm* — Fujitsu Patent Center

(57) ABSTRACT

A package substrate includes a substrate, a first connection terminal mounted over the substrate, the first connection terminal including a first land and a second land on the substrate, a first solder resist surrounding the first land and the second land, and a first solder ball formed straddling the first land and the second land; and a second connection terminal which is mounted over the substrate and disposed adjacent to the first connection terminal, the second connection terminal including a third land and a fourth land on the substrate, a second solder resist surrounding the third land and the fourth land, and a second solder ball formed straddling the third land and the fourth land.

4 Claims, 24 Drawing Sheets

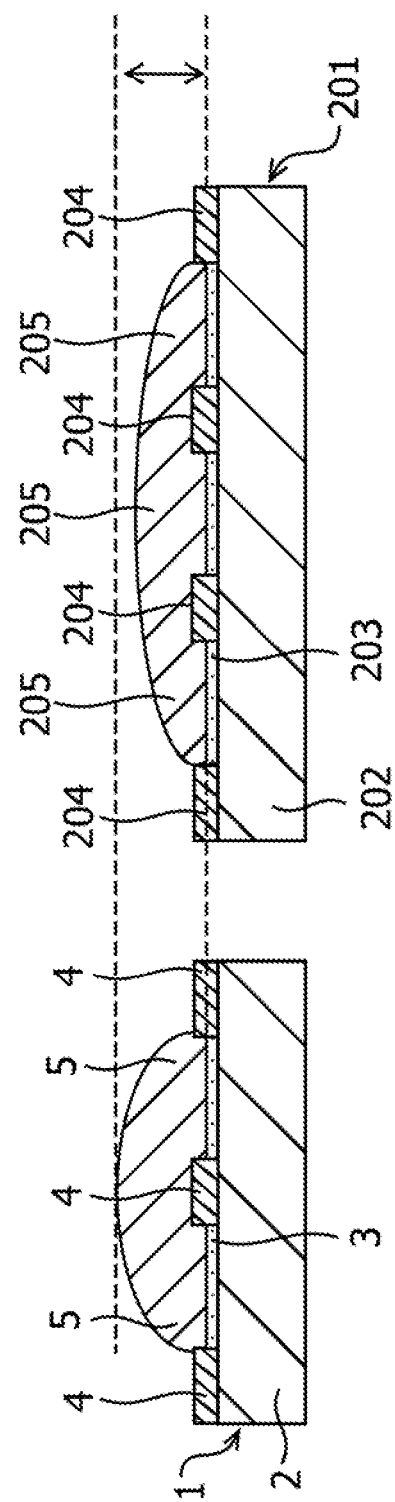

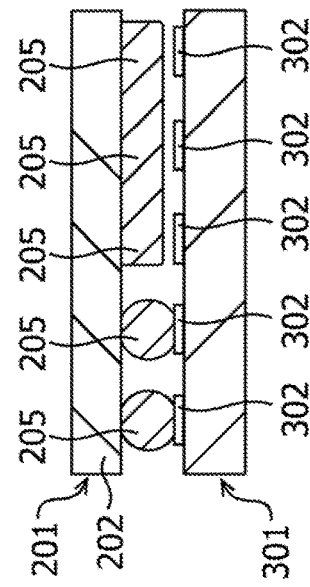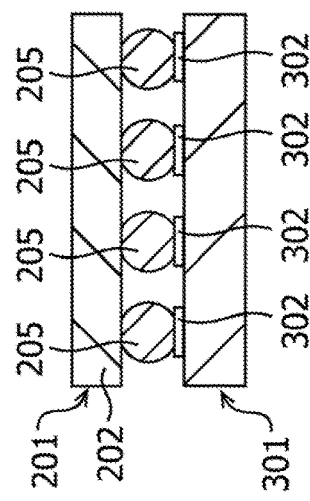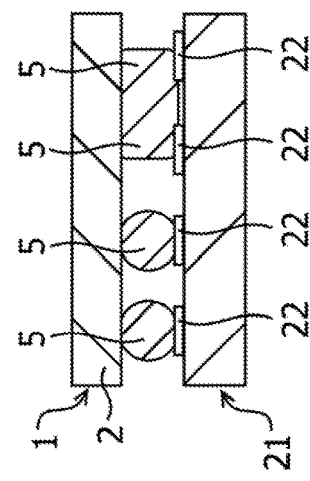

PACKAGE SUBSTRATE AND METHOD OF MANUFACTURING PACKAGE SUBSTRATE

CROSS-REFERENCE TO RELATED APPLICATION

This application is based upon and claims the benefit of priority of the prior Japanese Patent Application No. 2017-115291, filed on Jun. 12, 2017, the entire contents of which are incorporated herein by reference.

FIELD

The embodiment discussed herein is related to a package substrate and a method of manufacturing a package substrate.

BACKGROUND

A size of a package substrate increases with further high functionalization of an information apparatus and the increased number of pins of the package substrate. A semiconductor element is miniaturized, and the semiconductor element has low voltage and high current. A semiconductor package includes the package substrate and a semiconductor chip mounted on the upper surface of the package substrate. There is a ball grid array (BGA) as one of semiconductor package structures. In the semiconductor package of a BGA type, BGA balls (solder balls) are disposed in a matrix manner on the lower surface of the package substrate. In a case where the semiconductor package is installed on a printed circuit board (PCB), the semiconductor package is electrically connected to the printed circuit board through the BGA balls.

As an example of specifications of the package substrate, there are a substrate size: 50 mm×50 mm, a BGA pitch (BGA ball pitch): 1.0 mm, and a BGA ball size: φ 0.6 mm. As an example of specifications of a large package substrate, there are the substrate size: 76 mm×76 mm, the BGA pitch: 0.8 mm, and the BGA ball size: φ 0.5 mm. In the large semiconductor package, the substrate size is increased by changing the substrate size of the package substrate from 50 mm×50 mm to 76 mm×76 mm, and the BGA pitch is miniaturized by changing the BGA pitch from 1.0 mm to 0.8 mm. The semiconductor element installed on the package substrate is multi-cored, and a large current is supplied to the semiconductor element.

As a power supplying method from the package substrate to the semiconductor element, there is a horizontal power supplying method that supplies the power to the semiconductor element through wiring mounted in the package substrate and extending in the planar direction of the package substrate. In the case of the horizontal power supplying method, the number of core layers of the package substrate increases and the number of layers of the printed circuit board increases according to the supply of the large current. Therefore, when the power is supplied from the package substrate to the semiconductor element, a power supply drop increases. In order to reduce the power supply drop, a vertical power supplying method that supplies the power to the semiconductor element from a direction directly below the semiconductor element is employed.

As illustrated in FIG. 17, in a structure of a semiconductor package 90 of the vertical power supplying method, Cu pillars 81 for current supply are mounted under a printed substrate 80 and at a position directly below a semiconductor element 91 and electrical connection from the Cu pillars 81 to BGA balls 82 and 83 through the printed substrate 80 is performed to supply the power to the semiconductor element 91. The power supply drop when the power is supplied from a package substrate 92 to the semiconductor element 91 is reduced by employing the structure of the semiconductor package 90 of the vertical power supplying method.

In the semiconductor package 90 of the vertical power supplying method, for example, the semiconductor element 91 is installed on the center portion of the upper surface of the package substrate 92, and IO parts 93 are installed on the outer peripheral portion of the upper surface of the package substrate 92. The power to the semiconductor element 91 is supplied from the package substrate 92 through the BGA balls 82, and the power to the IO parts 93 is supplied from the package substrate 92 through the BGA balls 83. In order to satisfy an allowable current of the BGA ball 82 used for supplying the power to the semiconductor element 91, a size of the BGA ball 82 used for supplying the power to the semiconductor element 91 is larger than a size of the BGA ball 83 used for supplying the power to the IO parts 93. Therefore, a size of a land bonded to the BGA ball 82 for supplying the power to the semiconductor element 91 is designed to be larger than a size of a land bonded to the BGA ball 83 used for supplying the power to the IO parts 93. In FIG. 17, an illustration of the land is omitted, but the land is mounted on the lower surface of the package substrate 92. A part of the land is covered by resist, and the size of the land is a size of a portion of the land exposed from the resist.

FIGS. 18 to 23 are cross-sectional views of a package substrate 101 according to a comparative example. As illustrated in FIG. 18, BGA balls 103 are mounted on a land 102 mounted on the package substrate 101. In FIGS. 18 to 23, the lower surface of the package substrate 101 faces the upper side. A part of the land 102 is covered by a resist 104 mounted on the package substrate 101. A flux 105 is coated on the land 102. When the BGA balls 103 are mounted on the land 102, a position deviation of the BGA ball 103 may occur. In addition, as illustrated in FIG. 19, there is a case where the BGA balls 103 move and the adjacent BGA balls 103 approach each other as the flux 105 spreads after heat treatment is started and before the BGA balls 103 are melted.

When a size of the land 102 increases, a movement amount of the BGA ball 103 increases. As illustrated in FIG. 20, there is a case where the BGA balls 103 are connected to each other by the melting of the BGA balls 103 in a state where the adjacent BGA balls 103 approach each other during the heat treatment. In FIG. 21, a shape of the BGA ball 103 after the end of the heat treatment is indicated in the state where the adjacent BGA balls 103 are connected to each other. As illustrated in FIG. 21, the BGA ball 103 spreads on the land 102 in the state where the adjacent BGA balls 103 are connected to each other.

As illustrated in FIG. 22, there is a case where one of the adjacent BGA balls 103 is drawn into the other of the adjacent BGA balls 103 by the melting of the BGA balls 103 in the state where the adjacent BGA balls 103 approach each other during the heat treatment. In FIG. 23, a shape of the BGA ball 103 after the end of the heat treatment is indicated in the state where one of the adjacent BGA balls 103 is drawn into the other of the adjacent BGA balls 103. As illustrated in FIG. 23, a height of the BGA ball 103 increases and a place where the BGA ball 103 does not reach the land 102 is generated.

In a case where the height of the BGA ball 103 is lower than a specified value or the place where the BGA ball 103 does not reach the land 102 is generated by connecting the adjacent BGA balls 103 to each other, correction work such as removing the BGA ball 103 from the land 102 occurs and a lot of man-hours are desirable for the correction work. In addition, there is a case where the land 102 is peeled by the correction work leading to a failure of the package substrate 101. Therefore, it can be considered that a size of the BGA ball 103 is decreased to suppress the connection between the BGA balls 103. However, when the size of the BGA ball 103 is decreased, an allowable current value of the BGA ball 103 is reduced.

The followings are reference documents.
[Document 1] Japanese Laid-open Patent Publication No. 11-74637,
[Document 2] Japanese Laid-open Patent Publication No. 2010-161205, and
[Document 3] Japanese Laid-open Patent Publication No. 2011-119765.

SUMMARY

According to an aspect of the invention, a package substrate includes a substrate, a first connection terminal mounted over the substrate, the first connection terminal including a first land and a second land on the substrate, a first solder resist surrounding the first land and the second land, and a first solder ball formed straddling the first land and the second land; and a second connection terminal which is mounted over the substrate and disposed adjacent to the first connection terminal, the second connection terminal including a third land and a fourth land on the substrate, a second solder resist surrounding the third land and the fourth land, and a second solder ball formed straddling the third land and the fourth land, wherein a pitch between a center position of the second land and a center position of the third land adjacent to the second land is larger than a pitch between a center position of the first land and a center position of the second land.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 are sectional views of the package substrate according to the embodiment and the package substrate according to the comparative example;
FIG. 16A is a cross-sectional view of the package substrate and a printed circuit board according to the embodiment;
FIGS. 16B and 16C are cross-sectional views of the package substrates and printed circuit boards according to the comparative example.

DESCRIPTION OF EMBODIMENT

Hereinafter, an embodiment will be described in detail with reference to drawings. The following configurations of the embodiment are examples, and the embodiment discussed herein is not limited to the configurations of the embodiment.

Figure 1:
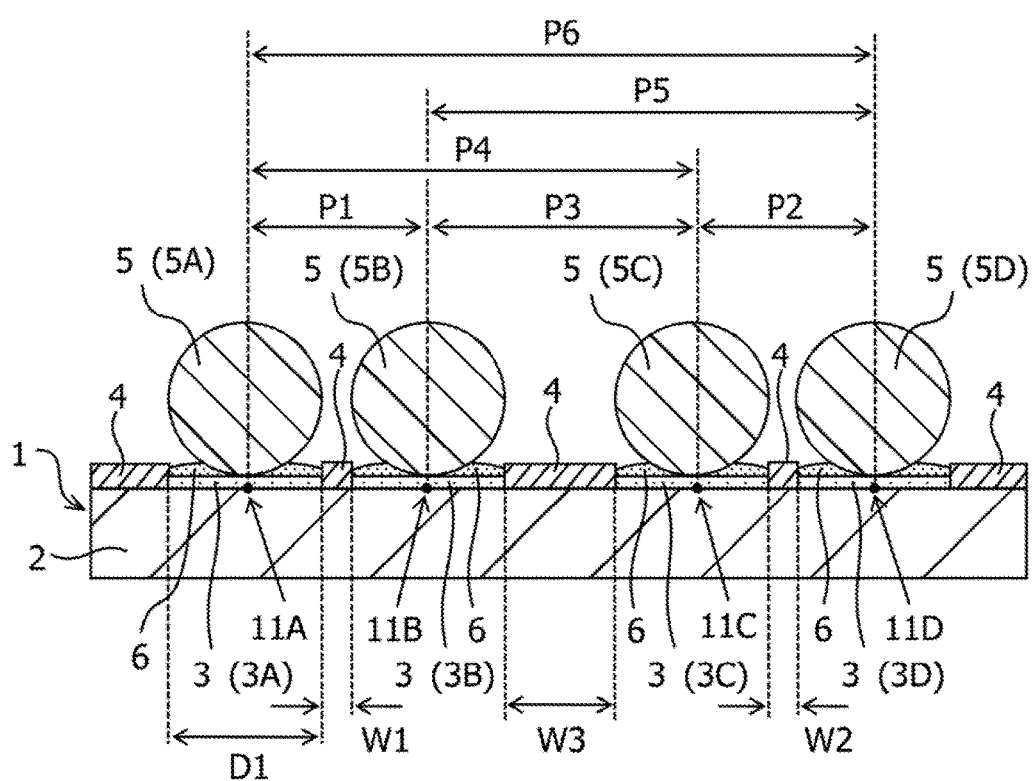
FIG. 1 is a cross-sectional view of a package substrate.

FIG. 1 is a cross-sectional view of a package substrate 1. FIG. 1 illustrates a part of the package substrate 1 before heat treatment. The package substrate 1 includes a substrate 2, a plurality of lands 3 mounted on the substrate 2, a solder resist 4 mounted on the substrate 2 and surrounding each of the plurality of lands 3, a plurality of BGA balls (solder balls) 5 mounted on the plurality of lands 3. The plurality of BGA balls 5 may be mounted on one land 3, and one BGA ball 5 may be mounted on one land 3. In an example illustrated in FIG. 1, one BGA ball 5 is mounted on one land 3. In a case where the plurality of BGA balls 5 are mounted on one land 3, the plurality of BGA balls 5 mounted on one land 3 are used for ground connection or power supply connection. That is, the plurality of BGA balls 5 mounted on one land 3 have the same potential. Two BGA balls 5 mounted on two lands 3 adjacent to each other may have the same potential. The land 3, the solder resist 4, and the plurality of BGA balls 5 are mounted on the lower surface (first surface) of the substrate 2. In FIGS. 1, 4, 6A, 6B, 13, and 15, the lower surface of the substrate 2 faces the upper side. A part of the solder resist 4 may be mounted on the plurality of lands 3. Flux 6 is coated between each land 3 and each BGA ball 5.

FIG. 1 illustrates a state where BGA balls 5A to 5D of the plurality of BGA balls 5 are mounted on lands 3A to 3D of the plurality of lands 3. In the embodiment, there is a case where the lands 3A to 3D and other lands 3 are described as the plurality of lands 3. There is a case where each of the lands 3A to 3D and other lands 3 is described as each land 3. There is a case where at least one of the lands 3A to 3D or other lands 3 is described as the land 3. In the embodiment, there is a case where the BGA balls 5A to 5D and other BGA balls 5 are described as the plurality of BGA balls 5. There is a case where each of the BGA balls 5A to 5D and other BGA balls 5 is described as each BGA ball 5. There is a case where at least one of the BGA balls 5A to 5D or other BGA balls 5 is described as the BGA ball 5.

A semiconductor element (semiconductor chip) and an IO part, and mold resin that covers the semiconductor element and the IO part are mounted on the upper surface (second surface) of the substrate 2. In FIGS. 1, 4, 6A, 6B, 13, and 15, the upper surface of the substrate 2 faces the lower side. The BGA ball 5 may be used for supplying the power to the semiconductor element or to the IO part. The substrate 2 is formed using, for example, a resin such as an epoxy resin, a polyimide resin, a phenol resin, or the like. The land 3 is, for example, a copper foil or an aluminium foil. The copper foil or the aluminium foil may be formed on the lower surface of the substrate 2 and etched to form the land 3 on the lower surface of the substrate 2. The solder resist 4 is formed using the resin such as the epoxy resin. A liquid-shaped solder resist 4 may be coated on the substrate 2, exposed, developed, and heated to form a solder resist 4 having a predetermined shape on the substrate 2. A film-shaped solder resist 4 may be stuck on the substrate 2 and heated to form a solder resist 4 having a predetermined shape.

Figure 2:
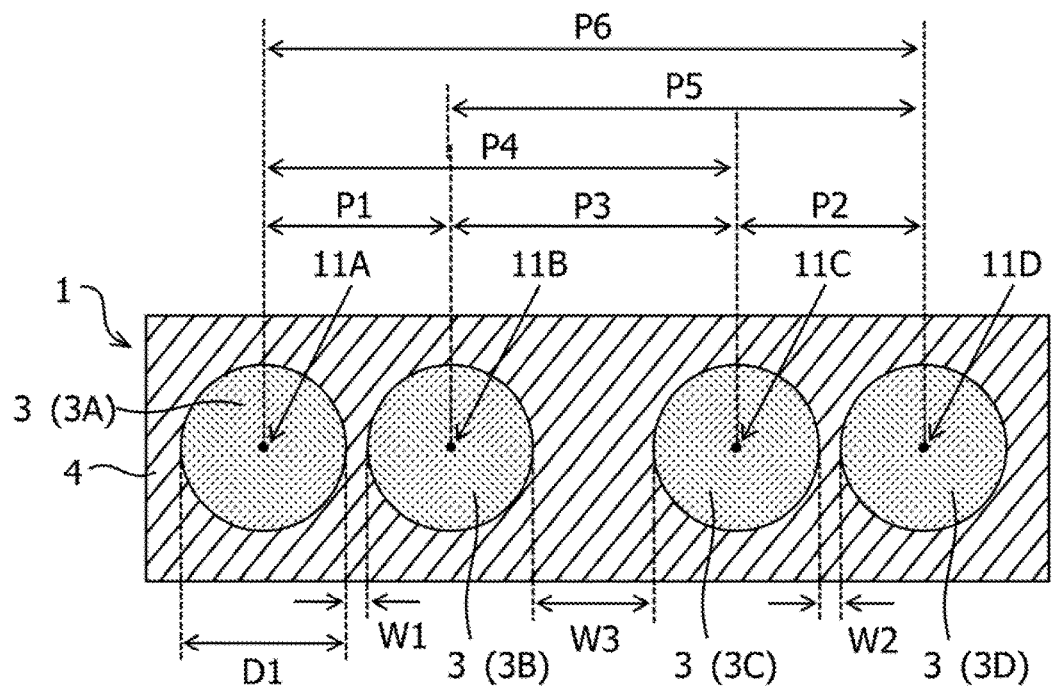
FIG. 2 is a bottom view of the package substrate.
Figure 3:
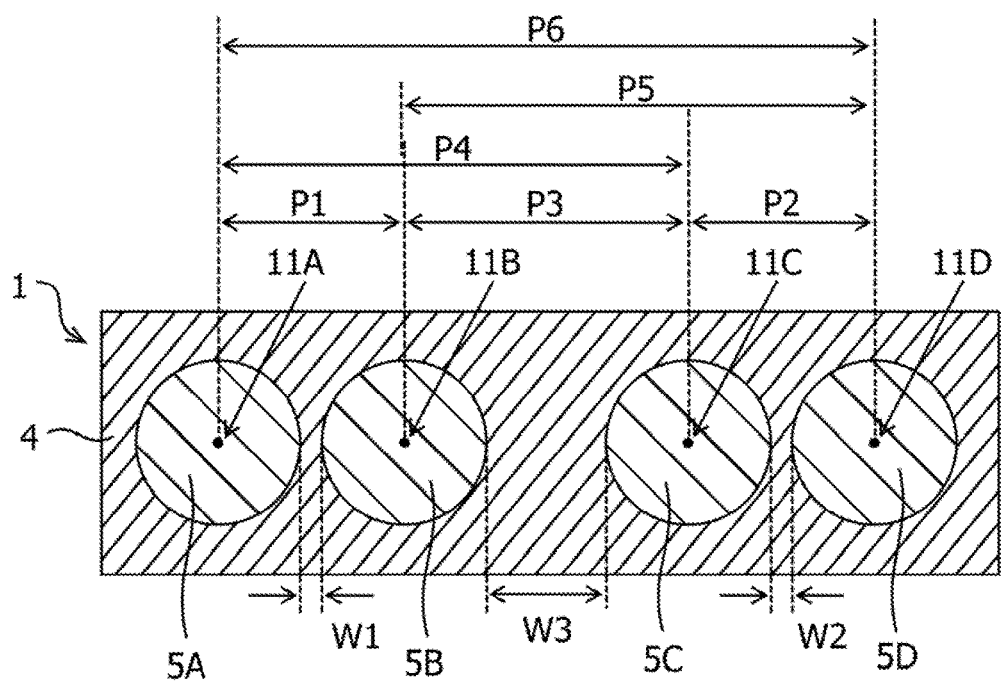
FIG. 3 is a bottom view of the package substrate.

The solder resist 4 has an opening, and the land 3 is exposed from the opening of the solder resist 4. A part of the land 3 may be exposed from the opening of the solder resist 4. Each BGA ball 5 is mounted on each land 3 exposed from the opening of the solder resist 4. Each BGA ball 5 is disposed at the center of each land 3. FIGS. 2 and 3 are bottom views of the package substrate 1. FIG. 2 illustrates the package substrate 1 before mounting the plurality of BGA balls 5 on the plurality of lands 3. FIG. 3 illustrates the package substrate 1 after mounting the BGA balls 5A to 5D on the lands 3A to 3D.

As illustrated in FIGS. 1 and 2, the land 3A and the land 3B are mounted on the substrate 2 so as to be adjacent to each other, and the land 3C and the land 3D are mounted on the substrate 2 so as to be adjacent to each other. In this manner, a plurality of groups including the two lands adjacent to each other are mounted on the substrate 2. For example, the lands 3A and 3B may be specified as one group, and the lands 3C and 3D may be specified as one group. In configuration examples of the package substrate 1 illustrated in FIGS. 1 and 2, the group including the lands 3A and 3B and the group including the lands 3C and 3D are adjacent to each other, and the group including the lands 3A and 3B and the group including the lands 3C and 3D are arranged in a row. As illustrated in FIGS. 1 and 3, the BGA ball 5A and the BGA ball 5B are respectively mounted on the lands 3A and 3B so as to be adjacent to each other, and the BGA ball 5C and the BGA ball 5D are respectively mounted on the lands 3C and 3D so as to be adjacent to each other. In this manner, a plurality of groups including the two BGA balls 5 adjacent to each other are mounted on the plurality of lands 3. For example, the BGA balls 5A and 5B may be specified as one group, and the BGA balls 5C and 5D may be specified as one group. In configuration examples of the package substrate 1 illustrated in FIGS. 1 and 3, the group including the BGA balls 5A and 5B and the group including the BGA balls 5C and 5D are adjacent to each other, and the group including the BGA balls 5A and 5B and the group including the BGA balls 5C and 5D are arranged in a row.

The lands 3A to 3D are mounted at predetermined positions 11A to 11D in the substrate 2. A center position of the land 3A and a predetermined position 11A of the substrate 2 may coincide with each other. A center position of the land 3B and a predetermined position 11B of the substrate 2 may coincide with each other. A center position of the land 3C and a predetermined position 11C of the substrate 2 may coincide with each other. A center position of the land 3D and a predetermined position 11D of the substrate 2 may coincide with each other. An opening diameter D1 of the solder resist 4 is equal to each other. The opening diameter D1 of the solder resist 4 may be equal to a diameter of the land 3 in plan view from a normal direction of the lower surface of the substrate 2. A width W1 of the solder resist 4 sandwiched between the lands 3A and 3B is equal to a width W2 of the solder resist 4 sandwiched between the lands 3C and 3D. Therefore, a pitch P1 between the predetermined positions 11A and 11B of the substrate 2 is equal to a pitch P2 between the predetermined positions 11C and 11D of the substrate 2.

A width W3 of the solder resist 4 sandwiched between the lands 3B and 3C is larger than the widths W1 and W2. Therefore, a pitch P3 between the predetermined positions 11B and 11C of the substrate 2 is larger than the pitches P1 and P2. A pitch P4 between the predetermined positions 11A and 11C of the substrate 2 is larger than the pitches P1 and P2. A pitch P5 between the predetermined positions 11B and 11D of the substrate 2 is larger than the pitches P1 and P2. A pitch P6 between the predetermined positions 11A and 11D of the substrate 2 is larger than the pitches P1 and P2. In this manner, each pitch between a position where one land 3 of two lands 3 included in one (first group) of two groups adjacent to each other is mounted and a position where one land 3 of two lands 3 included in the other (second group) of the two groups adjacent to each other is mounted is larger than the pitches between a position where one of two lands 3 included in each group is mounted and a position where the other of the two lands 3 included in each group is mounted.

Figure 4:
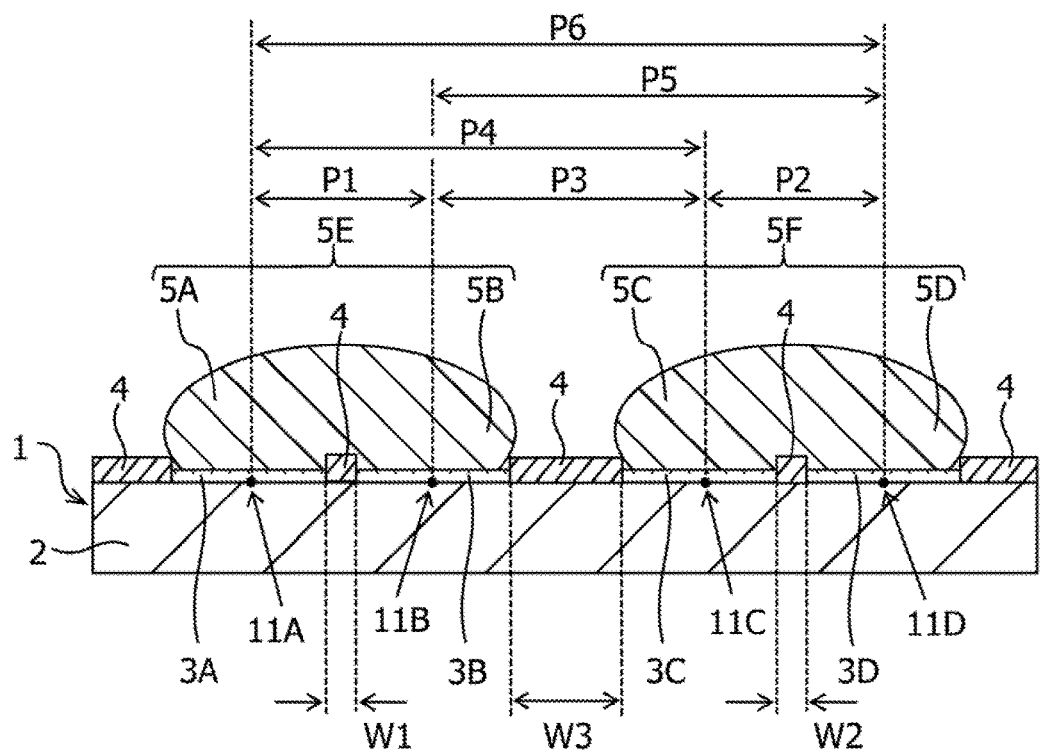
FIG. 4 is a cross-sectional view of the package substrate.
Figure 5:
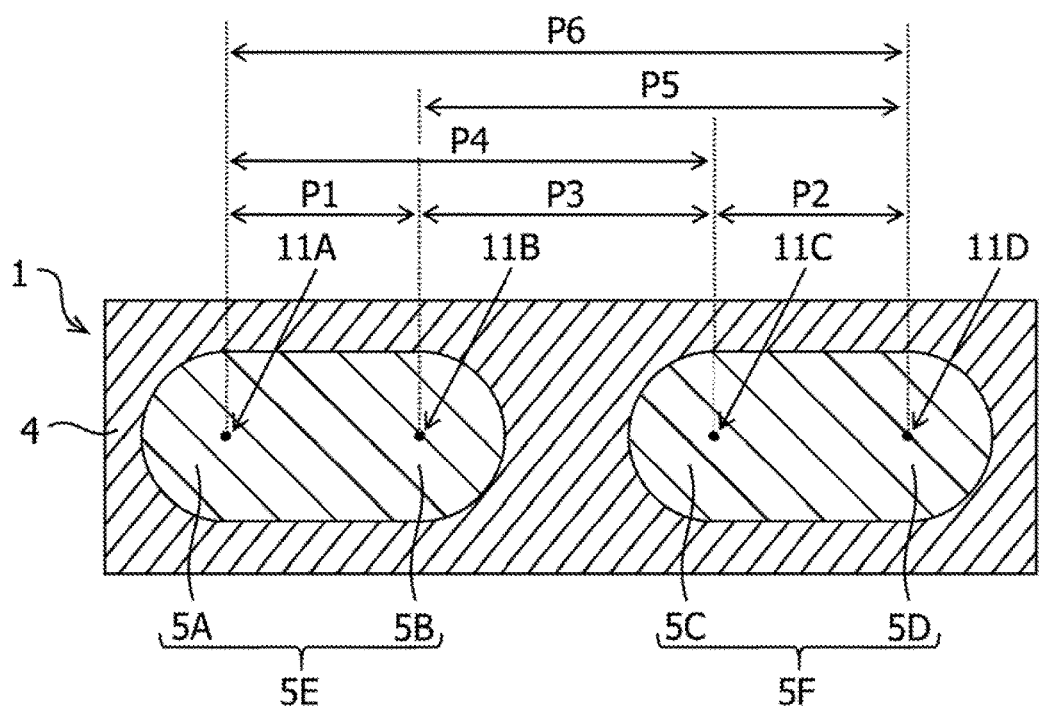
FIG. 5 is a bottom view of the package substrate.

FIG. 4 is a cross-sectional view of the package substrate 1. FIG. 5 is a bottom view of the package substrate 1. FIGS. 4 and 5 illustrate a part of the package substrate 1 after the heat treatment. As illustrated in FIGS. 4 and 5, the package substrate 1 includes the lands 3A and 3B, and a BGA ball 5E formed in a state of straddling the solder resist 4 sandwiched between the lands 3A and 3B. The BGA ball 5E has the BGA balls 5A and 5B. The BGA ball 5E has one elliptic shape in plan view from the normal direction of the lower surface of the substrate 2. The package substrate 1 includes one group including the lands 3A and 3B, and the BGA ball 5E formed in the state of straddling the solder resist 4 sandwiched between the lands 3A and 3B. As illustrated in FIGS. 4 and 5, the package substrate 1 includes the lands 3C and 3D, and a BGA ball 5F formed in a state of straddling the solder resist 4 sandwiched between the lands 3C and 3D. The BGA ball 5F has the BGA balls 5C and 5D. The BGA ball 5F has one elliptic shape in plan view from the normal direction of the lower surface of the substrate 2. The package substrate 1 includes one group including the lands 3C and 3D, and the BGA ball 5F formed in the state of straddling the solder resist 4 sandwiched between the lands 3C and 3D. In this manner, the package substrate 1 includes a plurality of groups including the two lands 3 of the plurality of lands 3 and the BGA ball 5 in the state of straddling the solder resist 4 sandwiched between the two lands 3.

A method of manufacturing the package substrate 1 according to the embodiment. First, a step of mounting the plurality of groups including two BGA balls 5 adjacent to each other on the plurality of lands 3 is performed. Next, a step of bonding the two BGA balls 5 included in each group in the state of straddling the solder resist 4 by performing the heat treatment is performed. The heat treatment may be performed when the package substrate 1 is installed on a printed circuit board. The heat treatment may be performed before the package substrate 1 is installed on a printed circuit board.

The heat treatment will be described. When the heat treatment is performed to the package substrate 1, an oxide on the surface of the land 3 and oxides of the BGA balls 5A to 5D are removed by the flux 6 coated on the land 3. As the heat treatment to the package substrate 1 progresses and the BGA balls 5A to 5D melt, the BGA balls 5A to 5D wet and spread on the lands 3. The BGA balls 5A and 5B are connected to each other straddling the solder resist 4 disposed between the lands 3A and 3B. Accordingly, the BGA ball 5E is formed in the state of straddling the solder resist 4 disposed between the lands 3A and 3B, and the BGA ball 5E melts in the state where the BGA ball 5E straddles the solder resist 4 disposed between the lands 3A and 3B. The BGA balls 5C and 5D are connected to each other straddling the solder resist 4 disposed between the lands 3C and 3D. Accordingly, the BGA ball 5F is formed in the state of straddling the solder resist 4 disposed between the lands 3C and 3D, and the BGA ball 5F melts in the state where the BGA ball 5F straddles the solder resist 4 disposed between the lands 3C and 3D. When the package substrate 1 is cooled, the BGA ball 5E is solidified, and the BGA balls 5A and 5B are bonded in the state of straddling the solder resist 4 disposed between the lands 3A and 3B. When the package substrate 1 is cooled, the BGA ball 5F is solidified, and the BGA balls 5C and 5D are bonded in the state of straddling the solder resist 4 disposed between the lands 3C and 3D.

As illustrated in FIGS. 4 and 5, the BGA balls 5A and 5B are short-circuited, and the BGA balls 5C and 5D are short-circuited. However, the BGA balls 5B and 5C are not short-circuited. In this manner, two BGA balls 5 included in each group are bonded. The two BGA balls 5 included in one (first group) of two groups adjacent to each other and the two BGA balls 5 included in the other (second group) of the two groups adjacent to each other are not bonded.

Figure 6A:
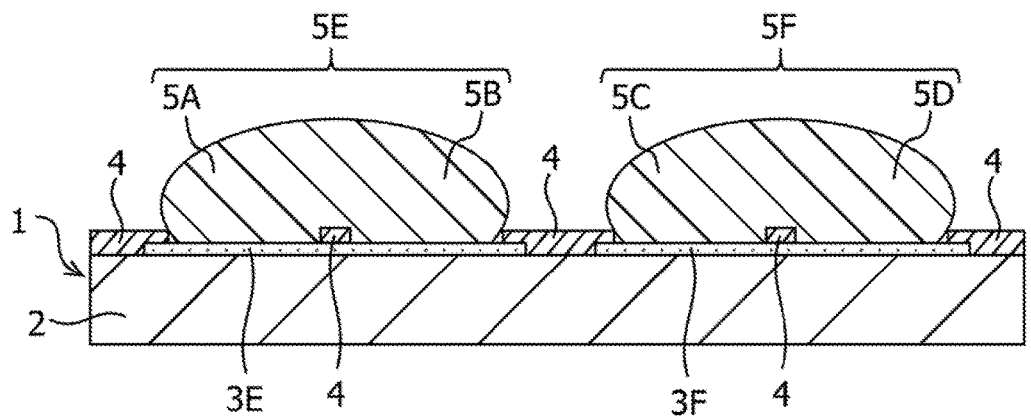
FIGS. 6A and 6B are cross-sectional views of the package substrate.

In configuration examples of the package substrate 1 illustrated in FIGS. 4 and 5, the BGA balls 5A to 5D are respectively mounted on the lands 3A to 3D. The BGA balls 5A and 5B have the same potential, and the BGA balls 5C and 5D have the same potential. As illustrated in FIG. 6A, lands 3E and 3F may be mounted on the substrate 2, the BGA balls 5A and 5B may be mounted on the land 3E, and the BGA balls 5C and 5D may be mounted on the land 3F, not limited to the configuration examples of the package substrate 1 illustrated in FIGS. 4 and 5. FIG. 6A is a cross-sectional view of the package substrate 1. The BGA balls 5A and 5B are bonded in a state of straddling a part of the solder resist 4 mounted on the land 3E. The BGA balls 5C and 5D are bonded in a state of straddling a part of the solder resist 4 mounted on the land 3F. In the case, the BGA balls 5A and 5B have the same potential, and the BGA balls 5C and 5D have the same potential. Each potential of the BGA balls 5A and 5B and each potential of the BGA balls 5C and 5D may be the same or different. The BGA balls 5A to 5D may be the power supply potential or the ground potential. The BGA balls 5A and 5B may be the power supply potential, and the BGA balls 5C and 5D may be the ground potential. The BGA balls 5A and 5B may be the ground potential, and the BGA balls 5C and 5D may be the power supply potential.

Figure 6B:
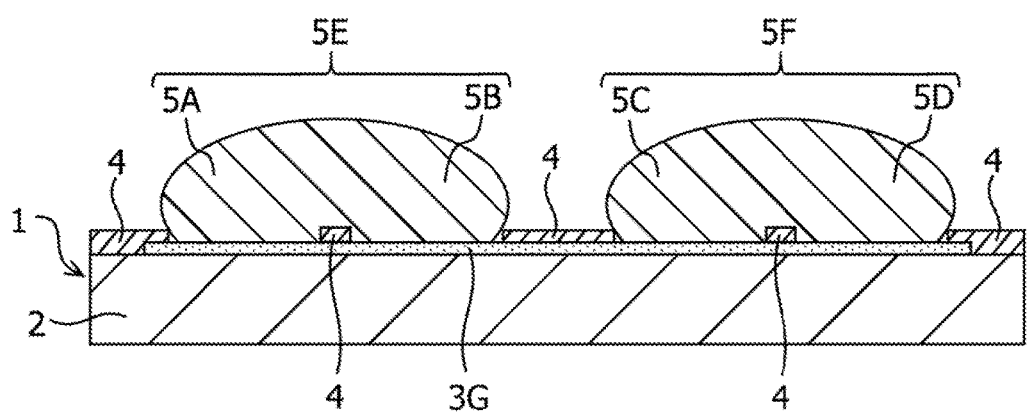

As illustrated in FIG. 6B, a land 3G may be mounted on the substrate 2, and the BGA balls 5A to 5D may be mounted on the land 3G. FIG. 6B is a cross-sectional view of the package substrate 1. The BGA balls 5A and 5B are bonded in the state of straddling the solder resist 4 disposed between the BGA balls 5A and 5B. The BGA balls 5C and 5D are bonded in the state of straddling the solder resist 4 disposed between the BGA balls 5C and 5D. In the case, the BGA balls 5A to 5D have the same potential. The BGA balls 5A to 5D may be the power supply potential or the ground potential.

Figure 7A:
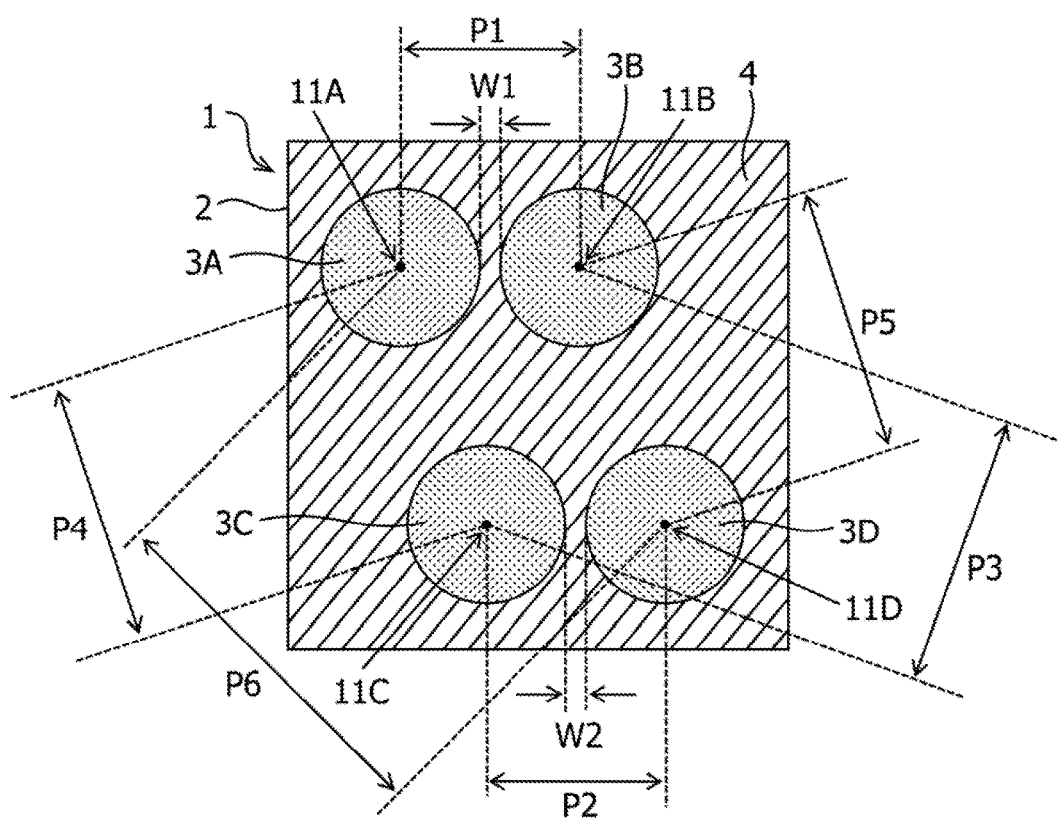
FIGS. 7A and 7B are bottom view of the package substrate.
Figure 7B:
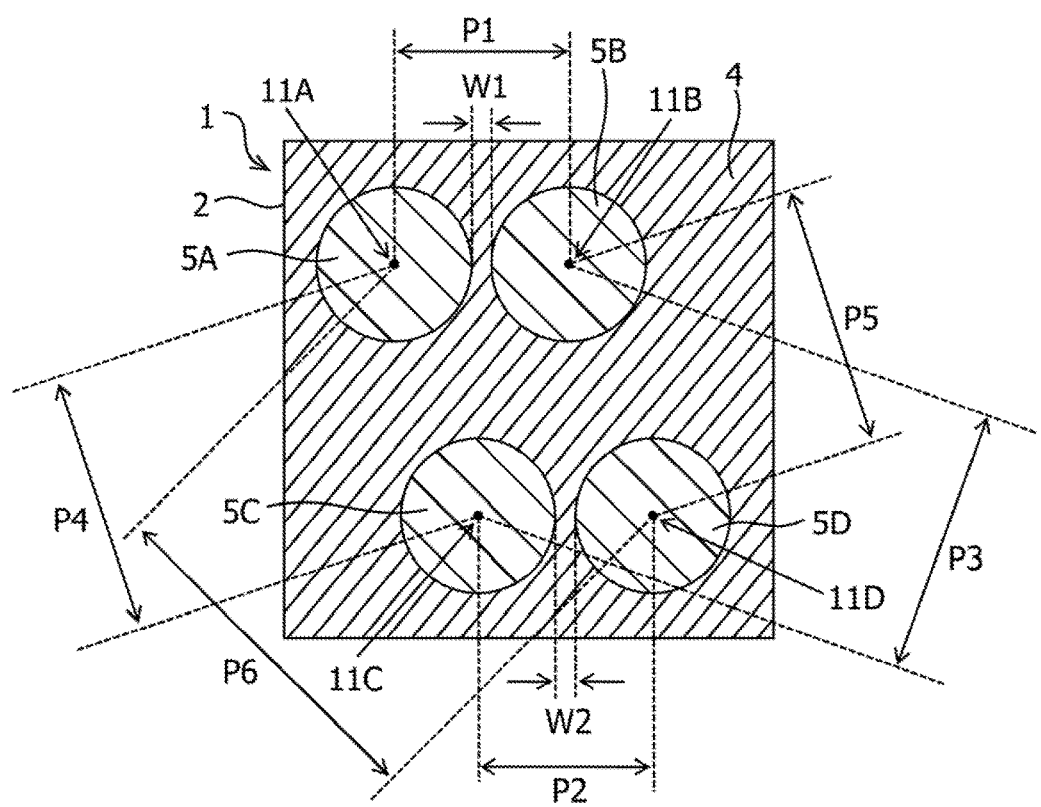

FIGS. 7A and 7B are bottom views of the package substrate 1. FIG. 7A illustrates the package substrate 1 before the plurality of BGA balls 5 are mounted on the lands 3. FIG. 7B illustrates the package substrate 1 after the plurality of BGA balls 5 are mounted on the lands 3. In a configuration example of the package substrate 1 illustrated in FIG. 7B, the group including the BGA balls 5A and 5B and the group including the BGA balls 5C and 5D are adjacent to each other, and the group including the BGA balls 5A and 5B and the group including the BGA balls 5C and 5D are arranged in two rows.

The lands 3A to 3D are mounted at predetermined positions 11A to 11D in the substrate 2. In configuration examples of the package substrate 1 illustrated in FIGS. 7A and 7B, the center position of the land 3A and a predetermined position 11A of the substrate 2 coincide with each other, and the center position of the land 3B and a predetermined position 11B of the substrate 2 coincide with each other. In the configuration examples of the package substrate 1 illustrated in FIGS. 7A and 7B, the center position of the land 3C and a predetermined position 11C of the substrate 2 coincide with each other, and the center position of the land 3D and a predetermined position 11D of the substrate 2 coincide with each other. An opening diameter of the solder resist 4 is equal to each other. A width W1 of the solder resist 4 disposed between the lands 3A and 3B is equal to a width W2 of the solder resist 4 disposed between the lands 3C and 3D. Therefore, a pitch P1 between the predetermined positions 11A and 11B in the substrate 2 is equal to a pitch P2 between the predetermined positions 11C and 11D in the land 3.

A pitch P3 between the predetermined positions 11B and 11C in the substrate 2 is larger than the pitches P1 and P2. A pitch P4 between the predetermined positions 11A and 11C in the substrate 2 is larger than the pitches P1 and P2. A pitch P5 between the predetermined positions 11B and 11D in the substrate 2 is larger than the pitches P1 and P2. A pitch P6 between the predetermined positions 11A and 11D in the substrate 2 is larger than the pitches P1 and P2. In this manner, each pitch between a position where one land 3 of two lands 3 included in one of two groups adjacent to each other is mounted and a position where one land 3 of two lands 3 included in the other of the two groups adjacent to each other is mounted is larger than the pitches between a position where one of two lands 3 included in each group is mounted and a position where the other of the two lands 3 included in each group is mounted.

The pitch P3 between the predetermined positions 11B and 11C in the substrate 2 is equal to the pitch P4 between the predetermined positions 11A and 11C in the substrate 2. The pitch P3 between the predetermined positions 11B and 11C in the substrate 2 is equal to the pitch P5 between the predetermined positions 11B and 11D in the substrate 2. A pitch between a first position where one of two lands 3 included in one of two groups is mounted and a second position where one of two lands 3 included in the other of the two groups is mounted is equal to a pitch between the first position and a third position where the other of two lands 3 included in the other of the two groups is mounted.

Figure 8:
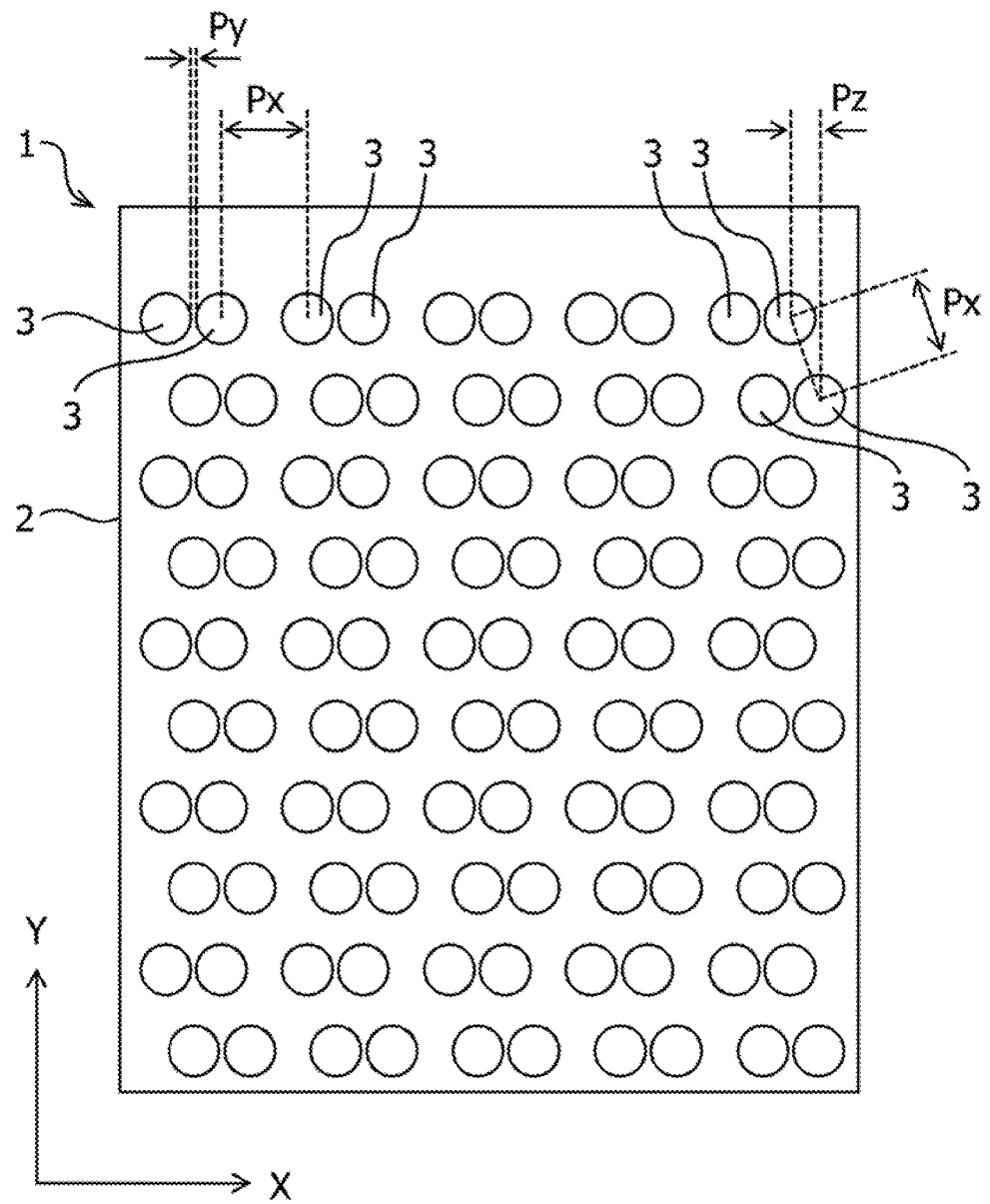
FIG. 8 is a bottom view of the package substrate.

FIG. 8 is a bottom view of the package substrate 1. As illustrated in FIG. 8, a plurality of groups including two lands 3 adjacent to each other are arranged on the package substrate 1. Px illustrated in FIG. 8 is a pitch between a position where one of two lands 3 included in one (first group) of two groups adjacent to each other and a position where one of two lands 3 included in the other (second group) of the two groups adjacent to each other, and one of the two lands 3 of the first group and one of the two lands 3 of the second group are adjacent to each other. Py illustrated in FIG. 8 is a distance of a gap between the two lands 3 included in each group.

Each pitch (Px) between the position where one of the two lands 3 included in one (first group) of the two groups adjacent to each other and the position where one of the two lands 3 included in the other (second group) of the two groups adjacent to each other may be obtained by the following equation (1). However, one of the two lands 3 of the first group and one of the two lands 3 of the second group are adjacent to each other.

$$Px = Po - B + A \qquad (1)$$

Figure 9:
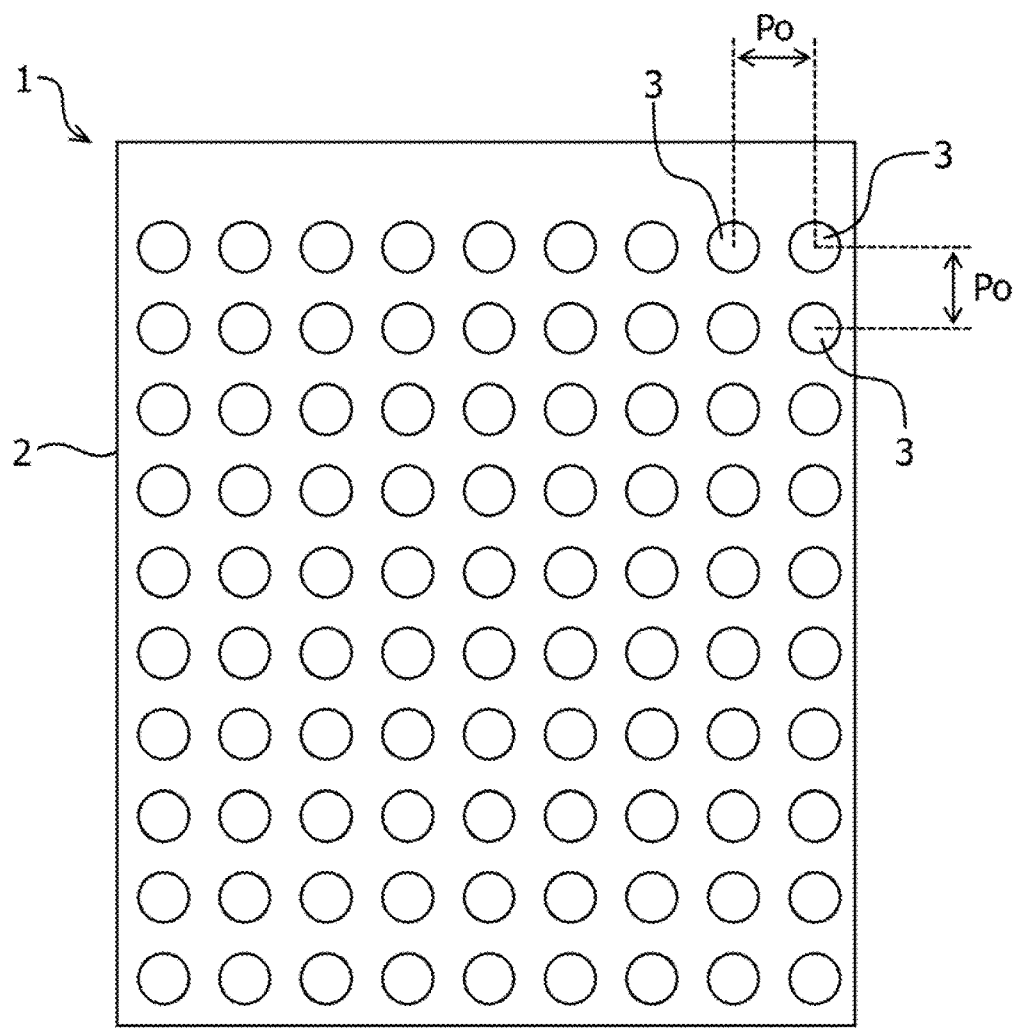
FIG. 9 is a bottom view of the package substrate when BGA balls are designed in a regular lattice arrangement.

Po and B in equation (1) are parameters when the land 3 is designed in a regular lattice arrangement, the land 3 is mounted on the package substrate 1, and the BGA ball is mounted on the land 3. Po in equation (1) is a pitch between a position where one of two lands 3 adjacent to each other is mounted and a position where the other of two lands 3 adjacent to each other is mounted. The B in equation (1) is the minimum gap of a gap between two BGA balls 5 in a case where the two BGA balls 5 adjacent to each other mounted on the two lands 3 adjacent to each other approach each other. The A in equation (1) is a value determined in consideration of a process coefficient and process factors such as warp and thermal behavior of the package substrate 1. FIG. 9 is a bottom view of the package substrate 1 when the land 3 is designed in the regular lattice arrangement, and the land 3 is mounted on the package substrate 1.

Figure 10A:
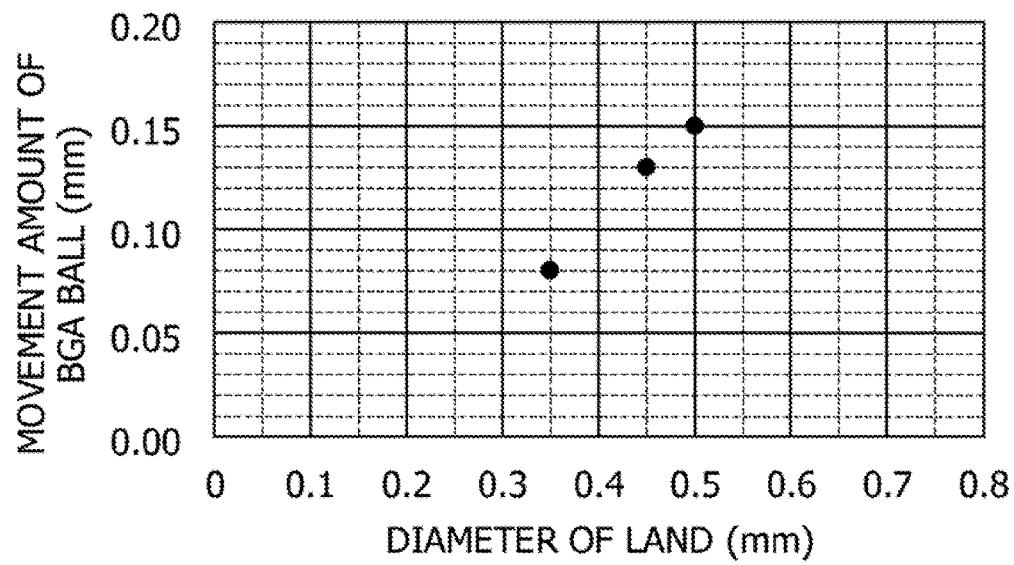
FIG. 10A is a graph illustrating a relationship between an opening diameter of a solder resist and a movement amount of a BGA ball.
Figure 10B:
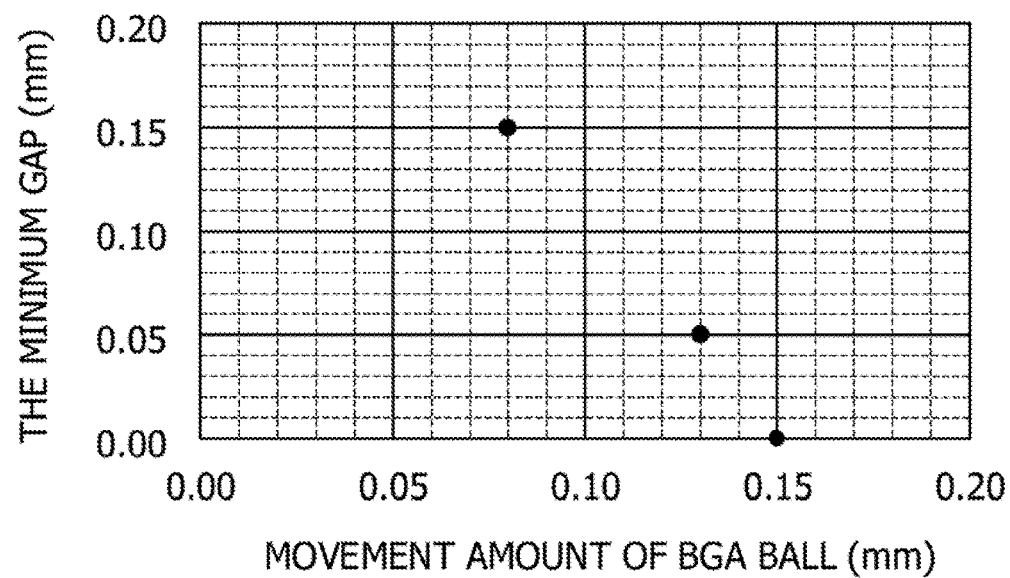
FIG. 10B is a graph illustrating a relationship between the movement amount of the BGA ball and the minimum gap of a gap between the BGA balls.

For example, Po=0.8 mm, B=0 mm, and A=0.05 mm are substituted into equation (1), Px=0.8−0+0.05=0.85 mm. In the example, a diameter of the BGA ball 5 is 0.5 mm, a thickness of the solder resist 4 is 0.02 mm, and the diameter of the land 3 and the opening diameter of the solder resist 4 are 0.5 mm. The B=0 mm can be obtained from FIG. 10A indicating a relationship between the diameter of the land 3 and a movement amount of the BGA ball 5, and FIG. 10B indicating a relationship between the movement amount of the BGA ball 5 and the minimum gap of the gap between the BGA balls 5. FIGS. 10A and 10B indicate the relationships described above in the case where the diameter of the BGA ball 5 is 0.5 mm and the thickness of the solder resist 4 is 0.02 mm.

The vertical axis of FIG. 10A is the movement amount (mm) of the BGA ball 5. The movement amount (mm) of the BGA ball 5 is a movement amount from a mounting position (center position of land 3) of the BGA ball 5 before the heat treatment. The BGA ball 5 moves as the flux 6 spreads after the heat treatment is started and before the BGA ball 5 melts. The horizontal axis of FIG. 10A is the diameter (mm) of the land 3. As indicated in FIG. 10A, the movement amount (mm) of the BGA ball 5 increases as the diameter of the land 3 increases. The movement amount (mm) of the BGA ball 5 of FIG. 10A may be obtained by simulation by appropriately changing a value of the diameter of the land 3 or may be measured by creating a test element group (TEG) substrate including the same configuration as the package substrate 1. As indicated in FIG. 10A, in a case where the diameter of the land 3 is 0.5 mm, the movement amount of the BGA ball 5 is 0.15 mm.

The horizontal axis of FIG. 10B is the minimum gap (mm) of the gap between two BGA balls 5 in the case where the two BGA balls 5 adjacent to each other approach each other. The horizontal axis of FIG. 10B is the movement amount (mm) of the BGA ball 5. As indicated in FIG. 10B, the minimum gap (mm) of the gap between two BGA balls 5 decreases as the movement amount (mm) of the BGA ball 5 increases. The minimum gap (mm) of the gap between two BGA balls 5 may be obtained by simulation by appropriately changing each value of the diameter of the BGA ball 5 and the thickness of the solder resist 4, or may be measured by creating a TEG substrate including the same configuration as the package substrate 1. As indicated in FIG. 10B, in a case where the movement amount of the BGA ball 5 is 0.15 mm, the minimum gap of the gap between two BGA balls 5 is 0 mm. In this manner, the B=0 mm can be obtained based on FIGS. 10A and 10B.

In the case where the diameter of the BGA ball 5 is 0.5 mm, the thickness of the solder resist 4 is 0.02 mm, and the diameter of the land 3 is 0.5 mm, the package substrate 1 is designed such that Px illustrated in FIG. 8 is equal to or larger than 0.85 mm. Accordingly, it is possible to suppress the connection between the two BGA balls 5 included in one (first group) of two groups adjacent to each other and the two BGA balls 5 included in the other (second group) of the two groups adjacent to each other. On the other hand, in a case where Po illustrated in FIG. 9 is 0.8 mm, the diameter of the BGA ball 5 is 0.5 mm, the thickness of the solder resist 4 is 0.02 mm, and the diameter of the land 3 is 0.5 mm, the two BGA balls 5 adjacent to each other are likely to be short-circuited.

For example, as illustrated in FIG. 8, in the case where two groups adjacent to each other are arranged in two rows in the X direction, the package substrate 1 is designed such that one row of the two groups adjacent to each other shifts in the X direction. In the case where the diameter of the BGA ball 5 is 0.5 mm, the thickness of the solder resist 4 is 0.02 mm, and the diameter of the land 3 is 0.5 mm, the package substrate 1 is designed such that shift width Pz of FIG. 8 is 0.275 mm. Accordingly, in a case where the two groups adjacent to each other are arranged in two rows in a predetermined direction (X direction in FIG. 8), it is possible to ensure Px=0.85 mm or more.

In the disposition of the land 3 illustrated in FIG. 8, the number of BGA balls 5 mounted on the land 3 increases from 90 to 100 in the same area compared with the disposition of the land 3 illustrated in FIG. 9. Therefore, it is possible to increase an allowable current margin with the package substrate 1 according to the embodiment.

Figure 11A:
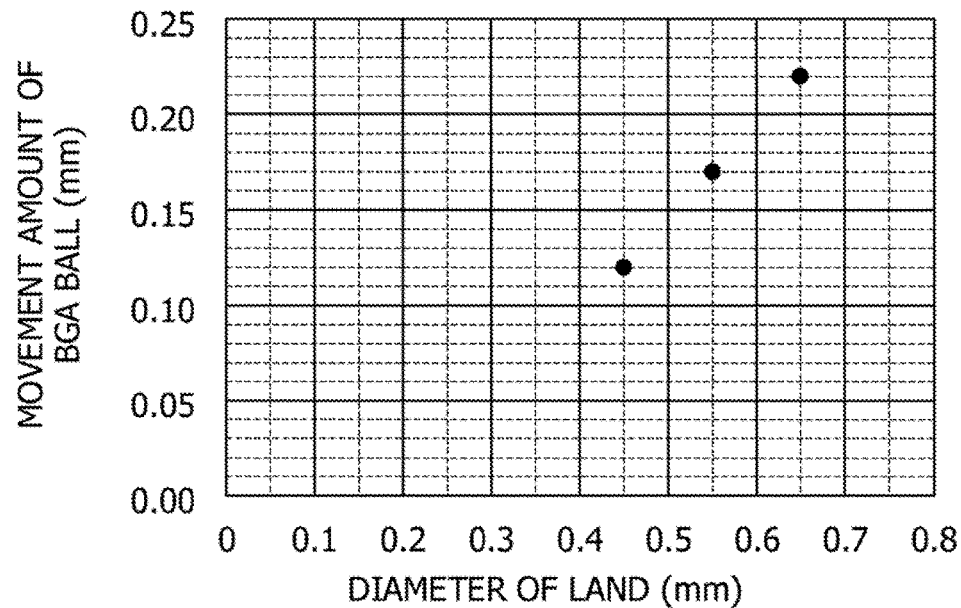
FIG. 11A is a graph illustrating a relationship between an opening diameter of a solder resist and a movement amount of a BGA ball.
Figure 11B:
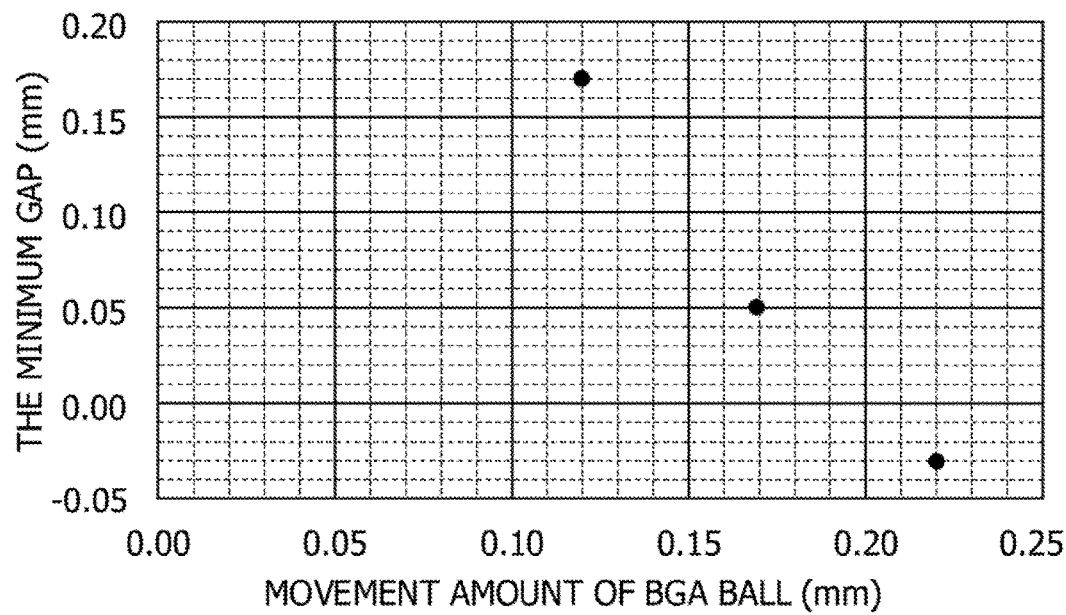
FIG. 11B is a graph illustrating a relationship between the movement amount of the BGA ball and the minimum gap of a gap between the BGA balls.

For example, Po=1.0 mm, B=0.17 mm, and A=0.05 mm are substituted into equation (1), Px=1.0−0.17+0.05=0.88 mm. In the example, the diameter of the BGA ball 5 is 0.6 mm, the thickness of the solder resist 4 is 0.02 mm, and the opening diameter of the land 3 is 0.45 mm. The B=0.17 mm can be obtained from FIG. 11A indicating a relationship between the diameter of the land 3 and the movement amount of the BGA ball 5, and FIG. 11B indicating a relationship between the movement amount of the BGA ball 5 and the minimum gap of the gap between the BGA balls 5. FIGS. 11A and 11B indicate the relationships described above in the case where the diameter of the BGA ball 5 is 0.6 mm and the thickness of the solder resist 4 is 0.02 mm.

The vertical axis of FIG. 11A and the horizontal axis of FIG. 11A are the same as the vertical axis of FIG. 10A and the horizontal axis of FIG. 10A. As indicated in FIG. 11A, in the case where the diameter of the land 3 is 0.45 mm, the movement amount of the BGA ball 5 is 0.12 mm. The vertical axis of FIG. 11B and the horizontal axis of FIG. 11B are the same as the vertical axis of FIG. 10B and the horizontal axis of FIG. 10B. As indicated in FIG. 11B, in the case where the movement amount of the BGA ball 5 is 0.12 mm, the minimum gap of the gap between the two BGA balls 5 is 0.17 mm. In this manner, the B=0.17 mm can be obtained based on FIGS. 11A and 11B.

Figure 12A:
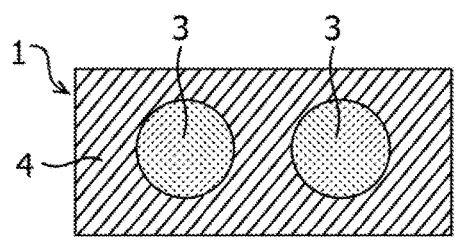
FIG. 12A is the bottom view of the package substrate according to an embodiment.
Figure 12B:
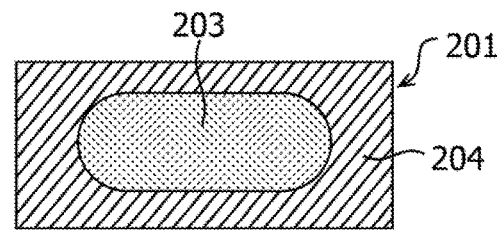
FIG. 12B is a bottom view of a package substrate according to a comparative example.
Figure 13:
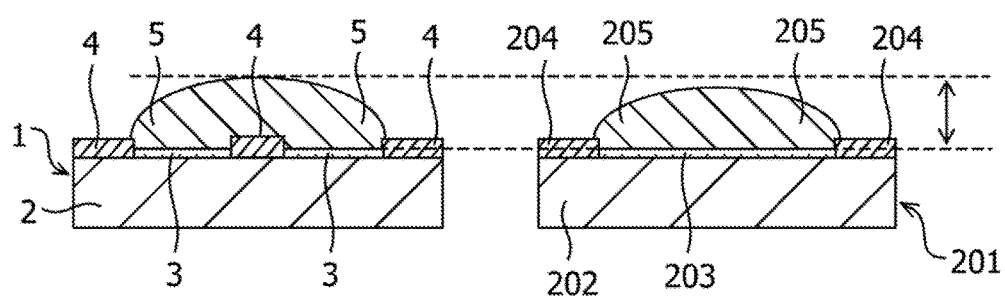
FIG. 13 are sectional views of the package substrate according to the embodiment and the package substrate according to the comparative example.

FIG. 12A is a bottom view of the package substrate 1 according to the embodiment. FIG. 12B is a bottom view of a package substrate 201 according to a comparative example. In FIG. 12A, an illustration of the BGA ball 5 is omitted. In FIG. 12B, an illustration of a BGA ball 205 is omitted. FIG. 13 are sectional views of the package substrate 1 according to the embodiment and the package substrate 201 according to the comparative example. The package substrate 1 according to the embodiment is illustrated in the left of FIG. 13, and the package substrate 201 according to the comparative example is illustrated in the right of FIG. 13.

In the package substrate 1 according to the embodiment, two round openings are formed in the solder resist 4 and the two lands 3 are brought close to each other to intentionally short-circuit the two BGA balls 5 adjacent to each other. In the package substrate 201 according to the comparative example, since one elliptical opening is formed in a solder resist 204 mounted on a substrate 202, an exposed portion of a land 203 has an elliptic shape. In the case where the exposed portion of the land 203 has the elliptic shape, when two BGA balls 205 adjacent each other are short-circuited, the height of the BGA ball 205 is lower than a specified value. In the case where the height of the BGA ball 205 is lower than the specified value, when the package substrate 201 is installed on the printed circuit board, an open failure occurs between the package substrate 201 and the printed circuit board.

Figure 14:
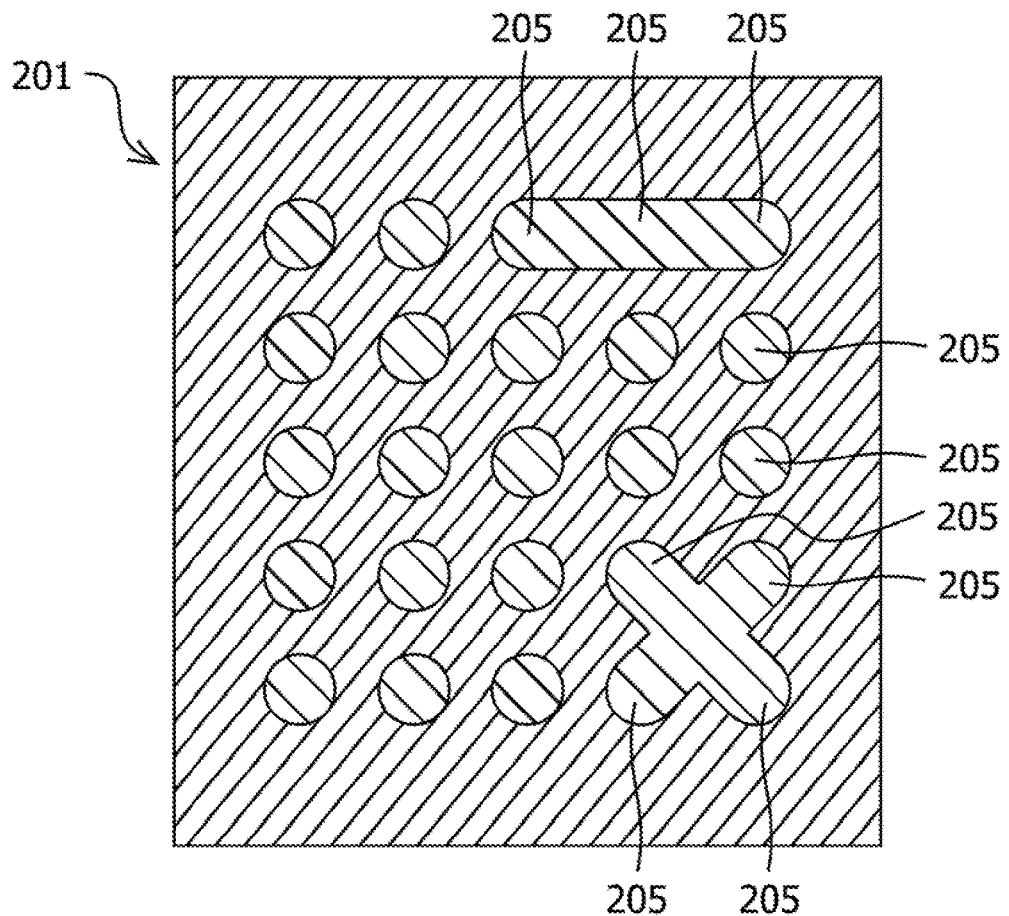
FIG. 14 is a bottom view of the package substrate according to the comparative example.
Figure 17:
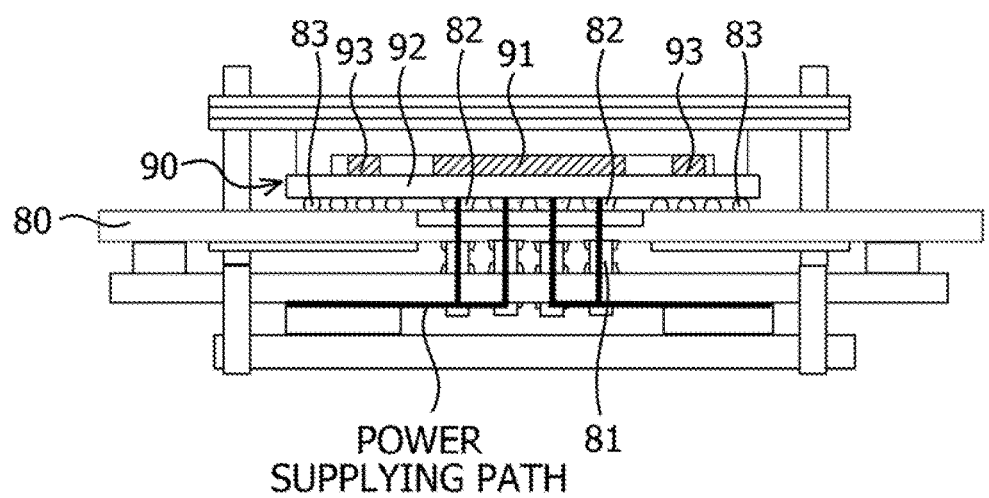
FIG. 17 is a diagram illustrating a structure of a semiconductor package of a vertical power supplying method.
Figure 18:
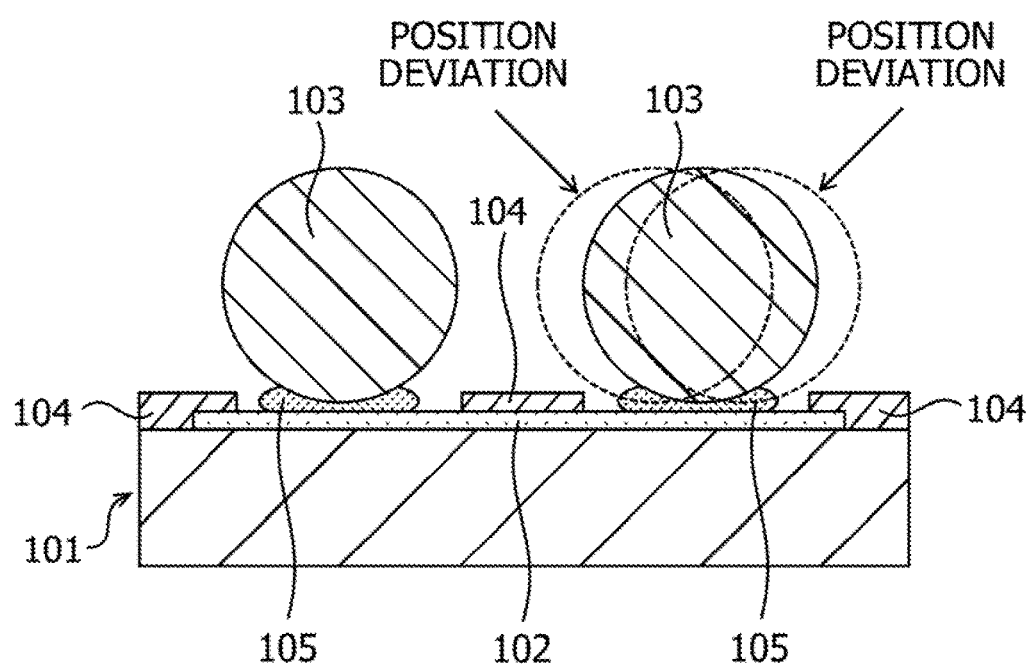
FIG. 18 is a cross-sectional view of a package substrate according to a comparative example.
Figure 19:
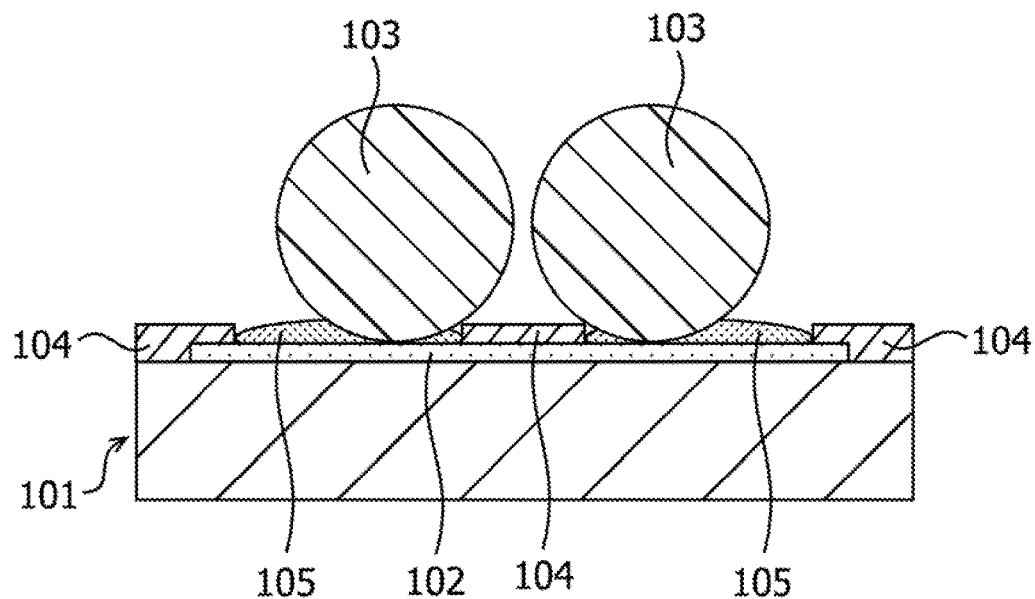
FIG. 19 is a cross-sectional view of the package substrate according to the comparative example.
Figure 20:
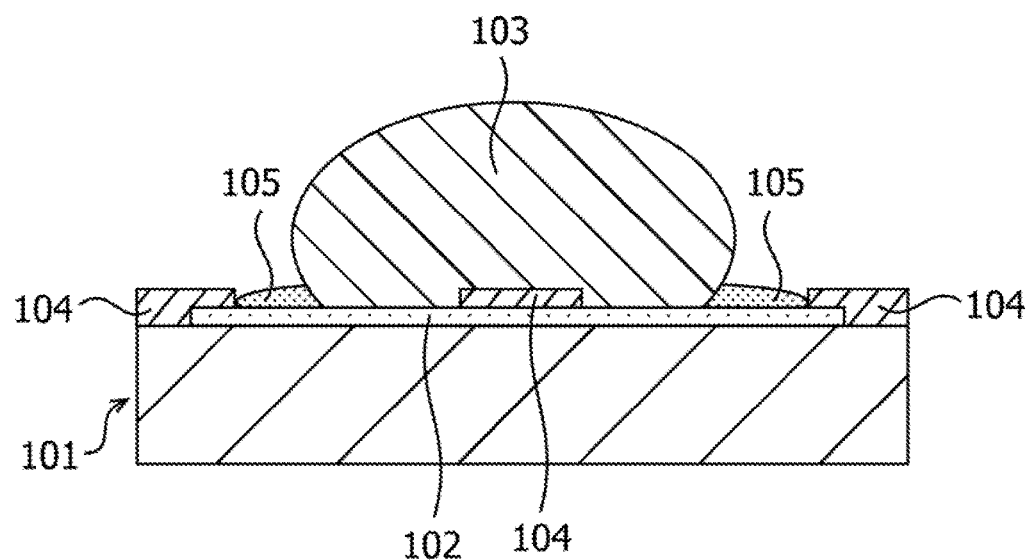
FIG. 20 is a cross-sectional view of the package substrate according to the comparative example.
Figure 21:
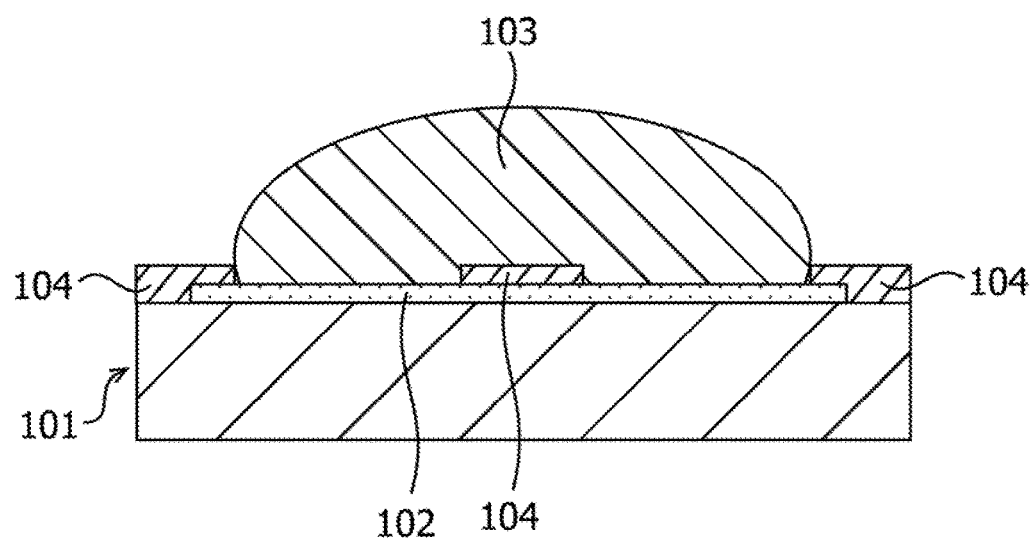
FIG. 21 is a cross-sectional view of the package substrate according to the comparative example.
Figure 22:
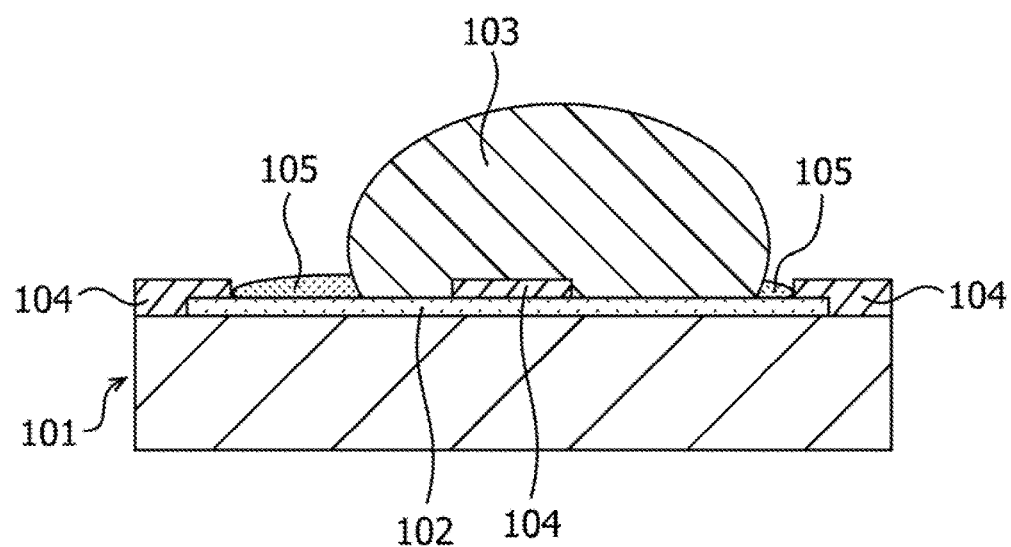
FIG. 22 is a cross-sectional view of the package substrate according to the comparative example.
Figure 23:
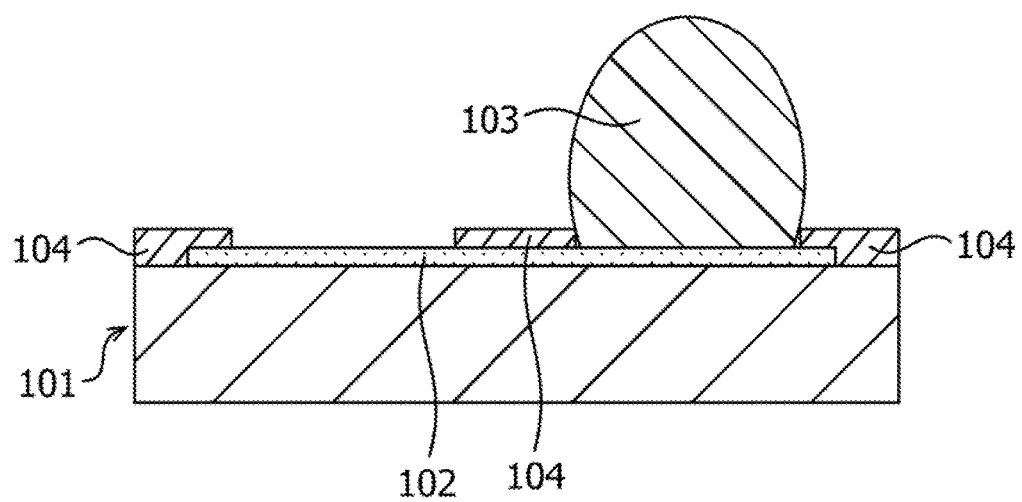
FIG. 23 is a cross-sectional view of the package substrate according to the comparative example.

FIG. 14 is a bottom view of the package substrate 201 according to the comparative example. As illustrated in FIG. 14, three BGA balls 205 are short-circuited and four BGA balls 205 are short-circuited. FIG. 15 is sectional views of the package substrate 1 according to the embodiment and the package substrate 201 according to the comparative example. In FIG. 15, the lower surface of the substrate 2 faces the upper side and the lower surface of the substrate 202 faces the upper side. When the three or more BGA balls 205 are short-circuited, the height of the BGA ball 205 is lower than the specified value. In the case where the height of the BGA ball 205 is lower than the specified value, when the package substrate 201 is installed on the printed circuit board, the open failure occurs between the package substrate 201 and the printed circuit board.

FIG. 16A is a cross-sectional view of the package substrate 1 and a printed circuit board 21 according to the embodiment. In FIG. 16A, an illustration of the land 3 and the solder resist 4 is omitted. In FIG. 16A, the lower surface of the substrate 2 faces the lower side. In FIGS. 16B and 16C, the lower surface of the substrate 202 faces the lower side. With the package substrate 1 according to the embodiment, the height of each BGA ball 5 in the state where the two BGA balls 5 adjacent to each other are short-circuited and the height of each BGA ball 5 in the state where the two BGA balls 5 adjacent to each other are not short-circuited are equal to each other. Therefore, as illustrated in FIG. 16A, when the package substrate 1 is installed on the printed circuit board 21, the BGA balls 5 are bonded to pad electrodes 22 of the printed circuit board 21 in a state where the two BGA balls 5 adjacent to each other are short-circuited. The package substrate 1 and the printed circuit board 21 are electrically connected by bonding the BGA balls 5 to the pad electrodes 22 of the printed circuit board 21.

FIGS. 16B and 16C are cross-sectional views of the package substrate 201 and a printed circuit board 301 according to the comparative example. In FIGS. 16B and 16C, an illustration of the land 203 and the solder resist 204 is omitted. In the package substrate 201 according to the comparative example illustrated in FIG. 16B, the BGA balls 205 are bonded to pad electrodes 302 of the printed circuit board 301 in a state where two BGA balls 205 adjacent to each other are not short-circuited. In the package substrate 201 according to the comparative example as illustrated in FIG. 16C, three BGA balls 205 are short-circuited. When the three or more BGA balls 205 are short-circuited, the height of the BGA ball 205 is lower than the specified value. Therefore, places where the BGA balls 205 does not reach the pad electrode 302 of the printed circuit board 301 are generated and the open failure occurs between the package substrate 201 and the printed circuit board 301 when the package substrate 201 is installed on the printed circuit board 301.

With the package substrate 1 according to the embodiment, since the two BGA balls 5 included in each group are bonded to each other, the allowable current value of a current flowing through the BGA ball 5 increases. With the package substrate 1 according to the embodiment, since the two BGA balls 5 included in one (first group) of two groups adjacent to each other and the two BGA balls 5 included in the other (second group) of the two groups adjacent to each other are not connected, it is possible to avoid connecting the three or more BGA balls 5 to each other. Therefore, since a state where the height of the BGA ball 5 is higher than the specified value is maintained, when the package substrate 1 is installed on the printed circuit board 21, the open failure between the package substrate 1 and the printed circuit board 21 is avoided. As a result, it is possible to reduce man-hours for correction work such as removing the BGA ball 5 from the land 3 and to avoid a failure of the package substrate 1 due to the correction work.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A package substrate comprising: a substrate; a first connection terminal mounted over the substrate, the first connection terminal including a first land and a second land on the substrate, a solder resist surrounding the first land and the second land, and a first solder ball formed straddling the first land and the second land; and a second connection terminal which is mounted over the substrate and disposed adjacent to the first connection terminal, the second connection terminal including a third land and a fourth land on the substrate, the solder resist surrounding the third land and the fourth land, and a second solder ball formed straddling the third land and the fourth land, wherein a pitch between a center position of the second land and a center position of the third land adjacent to the second land is larger than a pitch between a center position of the first land and a center position of the second land.

2. The package substrate according to claim 1, wherein the pitch between the center position of the first land and the center position of the second land is equal to a pitch between the center position of the third land and a center position of the fourth land.

3. The package substrate according to claim 1, wherein the first solder ball and the second solder ball have an elliptic shape.

4. A method of manufacturing a package substrate, the method comprising: forming a first pad and a second pad to be adjacent to each other on a substrate such that a gap between a center position of the first pad and a center position of the second pad becomes a first pitch; forming a third pad and a fourth pad to be adjacent to each other on the substrate such that a gap between a center position of the third pad and a center position of the fourth pad becomes the same as the first pitch, and a gap between the center position of the second pad and the center position of the third pad becomes higher than the first pitch; forming a first solder bump on the first pad, a second solder bump on the second pad, a third solder bump on the third pad, and a fourth solder bump on the fourth pad; forming a first solder ball by performing heat treatment and melting the first solder bump and the second solder bump to connect the first solder bump and the second solder bump; and forming a second solder ball by performing heat treatment and melting the third solder bump and the fourth solder bump to connect the third solder bump and the fourth solder bump.

* * * * *